United States Patent
Li et al.

(10) Patent No.: US 8,489,378 B2
(45) Date of Patent: Jul. 16, 2013

(54) SILICON CONTROLLED RECTIFIER MODELING

(75) Inventors: Junjun Li, Williston, VT (US); Rahul Nayak, Bhopal (IN)

(73) Assignee: International Business Machines Corporation, Armonk, NY (US)

( * ) Notice: Subject to any disclaimer, the term of this patent is extended or adjusted under 35 U.S.C. 154(b) by 734 days.

(21) Appl. No.: 12/652,139

(22) Filed: Jan. 5, 2010

(65) Prior Publication Data

US 2011/0166847 A1 Jul. 7, 2011

(51) Int. Cl.
*G06F 9/455* (2006.01)
*G06F 17/50* (2006.01)
*G05F 1/613* (2006.01)
*H02M 7/10* (2006.01)

(52) U.S. Cl.
USPC ............. 703/14; 716/106; 323/229; 363/68

(58) Field of Classification Search
USPC ............ 703/13, 14; 716/101, 106, 136, 109, 716/120, 133; 323/229, 231; 363/3, 61, 66, 363/67, 68, 69, 84, 126
See application file for complete search history.

(56) References Cited

U.S. PATENT DOCUMENTS

| | | | |
|---|---|---|---|
| 5,949,694 A | 9/1999 | Amerasekera et al. | |
| 6,493,850 B2 | 12/2002 | Venugopal et al. | |
| 7,024,646 B2 | 4/2006 | Logie et al. | |
| 7,181,352 B2 | 2/2007 | Iyer et al. | |
| 7,184,253 B1 | 2/2007 | Hartranft et al. | |
| 7,268,003 B2 | 9/2007 | Hayashi | |
| 7,302,378 B2 | 11/2007 | Hayashi | |
| 7,434,179 B2 | 10/2008 | Hayashi | |
| 8,115,343 B2* | 2/2012 | Sanders et al. | 307/108 |
| 2005/0065762 A1 | 3/2005 | Hayashi | |
| 2007/0045656 A1 | 3/2007 | Chen | |
| 2007/0139031 A1 | 6/2007 | Park et al. | |
| 2009/0039869 A1 | 2/2009 | Williams | |
| 2009/0044158 A1 | 2/2009 | Lilja | |
| 2009/0268361 A1* | 10/2009 | Mallikarjunaswamy | 361/56 |
| 2011/0016440 A1 | 1/2011 | Bergmann et al. | |

FOREIGN PATENT DOCUMENTS

| | | |
|---|---|---|
| EP | 1464968 A2 | 10/2004 |
| JP | 2001339052 A | 12/2001 |
| JP | 2004079952 A | 3/2004 |
| JP | 2005093802 A | 4/2005 |

OTHER PUBLICATIONS

Michael B. Steer, "Spice (User's Guide and reference)", Edition 1.3, Jul. 2007, 308 pages.*
Juliano et al., "A Novel SCR Macromodel for ESD Circuit Simulation", IEDM 2001, pp. 319-322.

(Continued)

*Primary Examiner* — David Silver
*Assistant Examiner* — Andre Pierre Louis
(74) *Attorney, Agent, or Firm* — Anthony J. Canale; Hoffman Warnick LLC

(57) ABSTRACT

A model for a silicon controlled rectifier includes three diode models connected in series, with the middle diode model being reverse biased. Each diode model corresponds to and can be configured to simulate DC operation of a junction in the silicon controlled rectifier. The model can be used to evaluate behavior of a circuit that includes the silicon controlled rectifier. For example, the circuit can include an electrostatic discharge protection circuit that includes the silicon controlled rectifier.

25 Claims, 8 Drawing Sheets

OTHER PUBLICATIONS

Di Sarro et al., "Evaluation of SCR—Based ESD Protection Devices in 90NM and 65NM CMOS Technologies", IEEE, 45$^{th}$ Annual International Reliability Physics Symposium, Phoenix, 2007 pp. 348-357.

Di Sarro et al., "A Scalable SCR Compact Model for ESD Circuit Simulation", IEEE, 46$^{th}$ Annual International Reliability Physics Symposium, Phoenix, 2008, pp. 254-261.

Gohler et al., "A Physically Based Parameter Extraction Scheme for SCR Models", 1997 IEEE, pp. 148-153.

Ma et al., "A Physically-Based Lumped-Charge SCR Model", 1993 IEEE, pp. 53-59.

Lou et al., "A Comprehensive Compact SCR Model for CDM ESD Circuit Simulation", IEEE, CDR 46$^{th}$ Annual International Reliability Physics Symposium, Phoenix, 2008, pp. 635-636.

Ramaswamy et al., "Circuit-Level Simulation of CDM-ESD and EOS in Submicron MOS Devices", EOS/ESD Symposium 1996, pp. 316-321.

Zhou et al., "Modeling Snapback of LVTSCR Devices for ESD Circuit Simulation Using Advanced BJT and MOS Models", EOS/ESD Symposium 2007, pp. 175-184.

Lou et al., "Silicon Controlled Rectifier (SCR) Compact Modeling Based on VBIC and Gummel-Poon Models", Solid-State Electronics, vol. 53, Issue 2, Feb. 2009, pp. 195-203, Abstract only.

Vassilev et al., "Snapback Circuit Model for Cascoded NMOS ESD Over-Voltage Protection Structures", 2003 IEEE, pp. 561-564.

Fankhauser et al., "Using Device Simulations to Optimize ESD Protection Circuits", IEEE, 2004, pp. 963-968.

Nitin Mohan et al., "Modeling ESD Protection", IEEE, 2005, pp. 21-24.

Zhou et al., "Modeling MOS Snapback for Circuit-Level ESD Simulation Using BSIM3 and VBIC Models", Proceedings of the Sixth International Symposium on Quality Electronic Design, 2005, 6 pages.

Calle, U.S. Appl. No. 12/826,958, Office Action Communication, Feb. 15, 2012, 22 pages.

Abhishek Ramanujan, NPL Publication, "Modeling IC Snapback Characteristics Under Electrosatic Discharge Stress", Nov. 2009.

Yuanzhong (Paul) Zhou, NPL Publication, "Modeling Snapback and Rise-Time effects in TLP Testing for ESD MOS Devices Using BSIM3 and VBIC Models", May 2005.

Yuanzhong (Paul) Zhou, NPL Publication, "Modeling snapback of LVTSCR Devices for ESD circuit simulation using advanced BJT and MOS models", EOS/ESD symposium 2007.

Calle, U.S. Appl. No. 12/826,958, Office Action Communication, Jun. 7, 2012, 24 pages.

Chun, Jung-Hoon, "ESD Protection Circuits for Advanced CMOS Technologies", 2006, 137 pages.

Li et al., "Layout Extraction and Verification Methodology for CMOS I/O Circuits", 35th Design Automation Conference, San Francisco, CA, 1998, 6 pages.

Chih-Yao Huang, "Simulation prediction of electrothermal behaviors of ESD N/PMOS devices", Solid-State Electronics, vol. 49, pp. 1925-1932, 2005.

Rickelt et al., "A Novel Transistor Model for Simulating Avalanche-Breakdown Effects in Si Bipolar Circuits", IEEE Journal of Solid-State Circuits, vol. 37, No. 9, pp. 1184-1197, Sep. 2002.

Vassilev et al., "MOSFET ESD Breakdown Modeling and Parameter Extraction in Advanced CMOS Technologies", IEEE Transactions on Electron Devices, vol. 53, No. 9, pp. 2108-2117, Sep. 2006.

Jia et al., "A Study of Snapback and Parasitic Bipolar Action for ESD NMOS Modeling", Proceedings of HDP, 2007, IEEE, 5 pages.

* cited by examiner

SILICON CONTROLLED RECTIFIER MODELING

TECHNICAL FIELD

The disclosure relates generally to circuit models (e.g., design structures), and more particularly, to a model for a silicon controlled rectifier.

BACKGROUND ART

A silicon controlled rectifier (SCR) is often used as an electrostatic discharge (ESD) protection device for a circuit. In this case, during normal operation of the circuit, the SCR is in an off state with a very high resistance. As a result, only leakage current passes through the SCR. However, after a sufficient voltage (i.e., a snapback trigger voltage) is applied, e.g., due to an ESD event, the SCR transitions to a low resistance state and begins conducting current, thereby facilitating the discharge of the current away from the other components in the circuit. A typical SCR is a PNPN device that includes two coupled bipolar transistors. FIGS. 1A and 1B show an illustrative SCR 2 and circuit diagram 4 of SCR 2 according to the prior art.

Various types of SCRs 2 have been developed for ESD protection and can be selected for implementation in a circuit based on the operating characteristics of the circuit and the corresponding SCR 2. For example, a breakdown triggered SCR (BDSCR) can be used as an ESD protection device when the signal on a bus may be as high as tens of volts peak to peak. Other SCRs used for ESD protection include a low-voltage triggering SCR (LVTSCR), which can be triggered by a grounded gate negative-channel metal oxide semiconductor (GGNMOS), a diode-string triggered SCR (DTSCR), and the like.

Regardless, it is desirable to accurately simulate the behavior of a circuit, including the ESD protection circuit and SCR, prior to manufacturing the circuit. Accurate simulation provides a better prediction of the behavior of the circuit, and can reduce the number of failures of circuit components due to improper operation, e.g., of the ESD protection circuit under an ESD event. However, circuit diagram 4 requires complex parameter extraction in order to simulate its behavior within a circuit. As a result, previous approaches have sought to provide an alternative model for use in conjunction with simulation models of circuits including an SCR 2.

To this extent, FIG. 2 shows an alternative circuit diagram of a model 6 of SCR 2 according to the prior art. Model 6 uses a simple, mathematical approach to modeling the behavior of SCR 2. In model 6, the shared base-collector junction of the PNP and NPN transistors of SCR 2 is replaced by a current controlled voltage source to simulate the snapback and a smoothing function is used to ensure continuity. However, model 6 loses much of the physical representation of SCR 2, and cannot be extended to a four terminal SCR model.

FIG. 3 shows another alternative circuit diagram of a model 8 of SCR 2 according to the prior art. Model 8 includes a simplification of the Ebers-Moll models for the corresponding bipolar junction transistors. While model 8 accurately represents the physical aspects of SCR 2 and includes four terminals, model 8 remains difficult to characterize and parameter extraction is more difficult than model 6. For example, model 8 requires the extraction of various parameters based on measurements of the bipolar junction transistors in order to successfully characterize model 8. The complexity of the model also brings in convergence problems during simulation.

SUMMARY

Aspects of the invention provide a model for a silicon controlled rectifier, which includes three diode models connected in series, with the middle diode model being reverse biased. Each diode model corresponds to and can be configured to simulate DC operation of a junction in the silicon controlled rectifier. The model can be used to evaluate behavior of a circuit that includes the silicon controlled rectifier. For example, the circuit can include an electrostatic discharge protection circuit that includes the silicon controlled rectifier.

A first aspect of the invention provides a computer-implemented method of generating an SCR model for at least one silicon controlled rectifier (SCR), the method comprising: including a unique diode model for each of a plurality of diodes electrically connected in series in the SCR model, the plurality of diode models including: a first forward biased diode model electrically connected between an anode terminal and a n-well node of the SCR model and corresponding to a first junction between an anode and a n-well of the at least one SCR; a second forward biased diode model electrically connected between a p-well node and a cathode terminal of the SCR model and corresponding to a second junction between a p-well and a cathode of the at least one SCR; and a reverse biased diode model electrically connected between the n-well node and the p-well node of the SCR model and corresponding to a third junction between the n-well and the p-well of the at least one SCR; and adjusting a set of parameters for each unique diode model using DC measurement data for the corresponding junction of the at least one SCR.

A second aspect of the invention provides a computer-implemented method of evaluating a circuit, the method comprising: obtaining a circuit model for the circuit, the circuit model including an SCR model for a silicon controlled rectifier (SCR) to the circuit model, wherein the SCR model includes: a first forward biased diode model electrically connected between an anode terminal and a n-well node of the SCR model, wherein the first forward biased diode model is configured to simulate DC operation of a first junction between an anode and a n-well of the SCR; a second forward biased diode model electrically connected between a p-well node and a cathode terminal of the SCR model, wherein the second forward biased diode model is configured to simulate DC operation of a second junction between a p-well and a cathode of the SCR; and a reverse biased diode model electrically connected between the n-well node and the p-well node of the SCR model, wherein the reverse biased diode model is configured to simulate DC operation of a third junction between the n-well and the p-well of the SCR; and simulating behavior of the circuit using the circuit model.

A third aspect of the invention provides a computer system comprising: a set of computing devices configured to generate an SCR model for at least one silicon controlled rectifier (SCR) by performing actions comprising: including a unique diode model for each of a plurality of diodes electrically connected in series in the SCR model, the plurality of diode models including: a first forward biased diode model electrically connected between an anode terminal and a n-well node of the SCR model and corresponding to a first junction between an anode and a n-well of the at least one SCR; a second forward biased diode model electrically connected between a p-well node and a cathode terminal of the SCR model and corresponding to a second junction between a p-well and a cathode of the at least one SCR; and a reverse biased diode model electrically connected between the n-well node and the p-well node of the SCR model and corresponding to a third junction between the n-well and the p-well of the at least one SCR; and adjusting a set of parameters for each unique diode model using DC measurement data for the corresponding junction of the at least one SCR.

A fourth aspect of the invention provides a computer system comprising: a set of computing devices configured to evaluate a circuit by performing actions comprising: obtaining a circuit model for the circuit, the circuit model including an SCR model for a silicon controlled rectifier (SCR) to the circuit model, wherein the SCR model includes: a first forward biased diode model electrically connected between an anode terminal and a n-well node of the SCR model, wherein the first forward biased diode model is configured to simulate DC operation of a first junction between an anode and a n-well of the SCR; a second forward biased diode model electrically connected between a p-well node and a cathode terminal of the SCR model, wherein the second forward biased diode model is configured to simulate DC operation of a second junction between a p-well and a cathode of the SCR; and a reverse biased diode model electrically connected between the n-well node and the p-well node of the SCR model, wherein the reverse biased diode model is configured to simulate DC operation of a third junction between the n-well and the p-well of the SCR; and simulating behavior of the circuit using the circuit model.

A fifth aspect of the invention provides a computer program comprising program code embodied in at least one computer-readable storage medium, which when executed, enables a computer system to implement a method of generating an SCR model for at least one silicon controlled rectifier (SCR), the method comprising: including a unique diode model for each of a plurality of diodes electrically connected in series in the SCR model, the plurality of diode models including: a first forward biased diode model electrically connected between an anode terminal and a n-well node of the SCR model and corresponding to a first junction between an anode and a n-well of the at least one SCR; a second forward biased diode model electrically connected between a p-well node and a cathode terminal of the SCR model and corresponding to a second junction between a p-well and a cathode of the at least one SCR; and a reverse biased diode model electrically connected between the n-well node and the p-well node of the SCR model and corresponding to a third junction between the n-well and the p-well of the at least one SCR; and adjusting a set of parameters for each unique diode model using DC measurement data for the corresponding junction of the at least one SCR.

Other aspects of the invention provide methods, systems, program products, and methods of using and generating each, which include and/or implement some or all of the actions described herein. The illustrative aspects of the invention are designed to solve one or more of the problems herein described and/or one or more other problems not discussed.

BRIEF DESCRIPTION OF THE DRAWINGS

These and other features of the disclosure will be more readily understood from the following detailed description of the various aspects of the invention taken in conjunction with the accompanying drawings that depict various aspects of the invention.

It is noted that the drawings may not be to scale. The drawings are intended to depict only typical aspects of the invention, and therefore should not be considered as limiting the scope of the invention. In the drawings, like numbering represents like elements between the drawings.

DETAILED DESCRIPTION

As indicated above, aspects of the invention provide a model for a silicon controlled rectifier, which includes three diode models connected in series, with the middle diode model being reverse biased. Each diode model corresponds to and can be configured to simulate DC operation of a junction in the silicon controlled rectifier. The model can be used to evaluate behavior of a circuit that includes the silicon controlled rectifier. For example, the circuit can include an electrostatic discharge protection circuit that includes the silicon controlled rectifier. As used herein, unless otherwise noted, the term "set" means one or more (i.e., at least one) and the phrase "any solution" means any now known or later developed solution.

The model captures the snapback and high current turn-on characteristics of an SCR. An embodiment of the new model comprises a physics-based model structure, and can enable reduced measurement and parameter extraction efforts over previously proposed models. In the model, physical structures of the SCR are represented by conventional electrical elements for low current operation of the SCR. Additionally, the model can comprise a circuit topology that provides alternate paths for high current and low current operation. The model's circuit includes a current controlled voltage source, which can be modeled with a smoothing function that switches between the low and high current operating modes of the SCR.

Figure 4A:
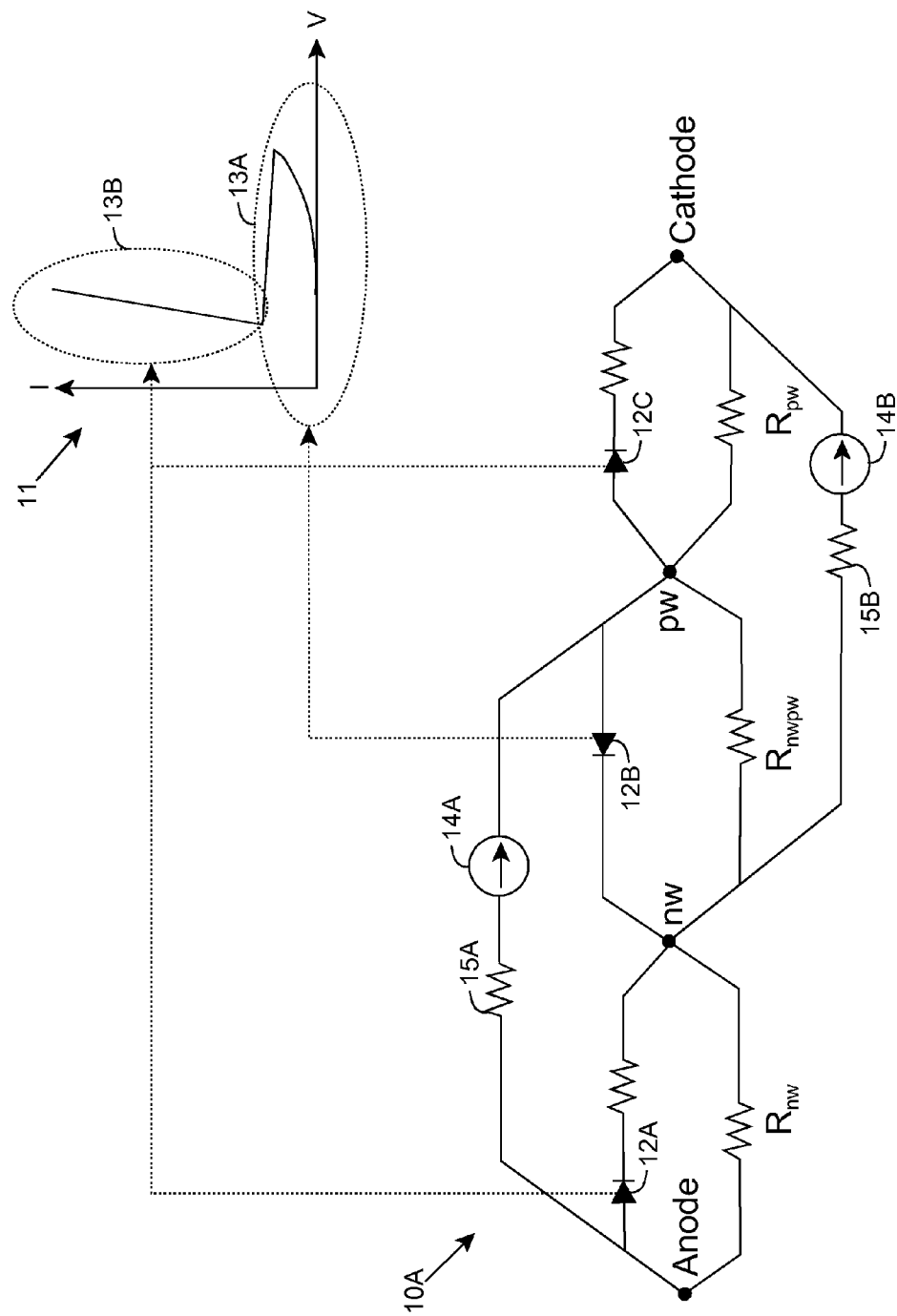
FIG. 4A shows an illustrative circuit diagram of a model of an SCR and the corresponding current-voltage (I-V) characteristics of the model according to an embodiment.

Turning to the drawings, FIG. 4A shows an illustrative circuit diagram of a model 10A for an SCR 2 (FIG. 1A) and the corresponding current-voltage (I-V) characteristics 11 for the model 10A according to an embodiment. Model 10A is configured to model a BDSCR. As illustrated model 10A includes three diodes 12A, 12B, 12C connected in series. In particular, diode 12A is electrically connected between an anode terminal (Anode) and a n-well node (nw), diode 12B is electrically connected between the n-well node and a p-well node (pw), and diode 12C is electrically connected between the p-well node and a cathode terminal (Cathode). Additionally, model 10A includes resistors $R_{nw}$, $R_{nwpw}$, $R_{pw}$, each of which is electrically connected in parallel with a corresponding diode 12A, 12B, 12C, respectively.

Each diode 12A, 12B, 12C represents the corresponding junction of the various physical regions of SCR 2. In particular, diode 12A corresponds to the P-N junction between the anode and the n-well of SCR 2, diode 12B corresponds to the N-P junction between the n-well and p-well of SCR 2, and diode 12C corresponds to the P-N junction between the p-well and cathode of SCR 2. The resistors $R_{nw}$ and $R_{pw}$ model the resistance of the n-well of SCR 2 and p-well of SCR 2, respectively.

As illustrated, in model 10A, diodes 12A, 12C operate in forward bias during normal operation of the SCR 2, while diode 12B operates in reverse bias mode in series with diodes 12A, 12C. As a result, the I-V characteristics 11 of the SCR 2 before snapback, indicated by region 13A, are primarily governed by diode 12B. Additionally, the reverse breakdown of diode 12B causes the snapback of the SCR 2. After the reverse breakdown of diode 12B, the I-V characteristics 11 of the SCR 2, indicated by region 13B, are largely controlled by diodes 12A, 12C. For example, the on state resistance of these diodes 12A, 12C controls the on state resistance of the SCR 2. In an embodiment, diode 12A is a p+nwell diode and diode 12C is a n+pwell diode, while diode 12B is a pwell-nwell diode.

Model 10A further includes a pair of current controlled voltage sources 14A, 14B, which provide alternative current paths between the anode terminal and cathode terminal of the SCR 2 to two of the series connected diodes 12A, 12B, 12C. In particular, voltage source 14A provides an alternative current path to diodes 12A, 12B between the anode terminal and the p-well node, while voltage source 14B provides an alternative current path to diodes 12B, 12C between the cathode terminal and the n-well node. Each current controlled voltage source 14A, 14B comprises a very high resistance (e.g., mega ohms) with respect to the diode path before the snapback of the SCR 2 (e.g., the reverse breakdown of diode 12B), and a very low resistance (e.g., a few ohms) with respect to the diode path after snapback. As a result, voltage sources 14A, 14B provide an additional path for high current operation of the model 10, while the relatively high resistance before snapback prevents current from flowing through voltage sources 14A, 14B during low current operation.

Since the current flowing through the SCR 2 increases rapidly after the snapback, the impedance of the current controlled voltage sources 14A, 14B can be determined by the current flowing there through. The series resistance 15A, 15B of each current controlled voltage source 14A, 14B can be used to convert the current into a voltage. As a result, instead of using the current flowing through the voltage sources 14A, 14B, which can be difficult when mathematically describing a behavioral source, the value of the voltage across the series resistance 15A, 15B multiplied by the value of the resistance can be used. In an illustrative embodiment, user 18 (FIG. 5) can select the resistance of the series resistance 15A, 15B to provide a scaling relation for the calculation.

In an embodiment, model 10A includes a mathematical formula for modeling the operation of current controlled voltage sources 14A, 14B. To this extent, the mathematical formula can be selected to maintain continuity between the off state of the SCR 2 and the on state of the SCR 2. For example, the mathematical formula can comprise a functional form that ensures a smooth switch between high current (e.g., above snapback) and low current (e.g., prior to snapback) operation of SCR 2. In a more particular embodiment, the mathematical formula comprises:

$$v = -\text{mag} \times [\tan h(pdr \times i)] \times [\tan h(ndr \times (i - i_{hold}) - v_{hold}],$$
where mag is the pre-multiplication factor;

pdr is the positive dynamic resistance for voltage sources 14A, 14B (the resistance offered in the blocking portion 13A of the I-V characteristics 11);

ndr is the negative dynamic resistance for voltage sources 14A, 14B;

ndr is the current through the voltage sources 14A, 14B;

$i_{hold}$ is the holding current for the voltage sources 14A, 14B; and $v_{hold}$ is the holding voltage for the voltage sources 14A, 14B.

In this case, the parameters $v_{hold}$, $i_{hold}$, and ndr can be used to control the holding voltage and the holding current values for the model 10A of SCR 2, while the parameters pdr and mag can define the positive dynamic resistance offered by current controlled voltage sources 14A, 14B before the snapback. To this extent, the mag parameter can be adjusted so that model 10A will have a desired snapback voltage. In an embodiment, computer system 20 (FIG. 5) sets the mag parameter such that the voltage drop in the diode series path plus the snapback voltage of the current controlled voltage sources 14A, 14B is the desired snapback voltage for the model 10A. While model 10A is shown and described as including two voltage sources 14A, 14B modeled by the same mathematical formula with the same parameters, it is understood that model 10A can be modified to include only a single voltage source or voltage sources 14A, 14B can be modeled using different mathematical formulas and/or the same mathematical formula with different parameters.

As discussed herein, model 10A can be included in a circuit model of a circuit comprising various components including at least one SCR 2. In an embodiment, the SCR 2 is implemented as part of an ESD protection circuit for a larger circuit. For example, an SCR 2 in the breakdown configuration can be utilized similar to a double diode, in which one SCR 2 is electrically connected between the pad and ground, and another SCR 2 is electrically connected between power and the pad. As a result, the various components of model 10A are connected in the breakdown configuration, in which the anode terminal is electrically connected directly to the n-well node and the cathode terminal is electrically connected directly to the p-well node, thereby providing a two terminal model.

Figure 4B:
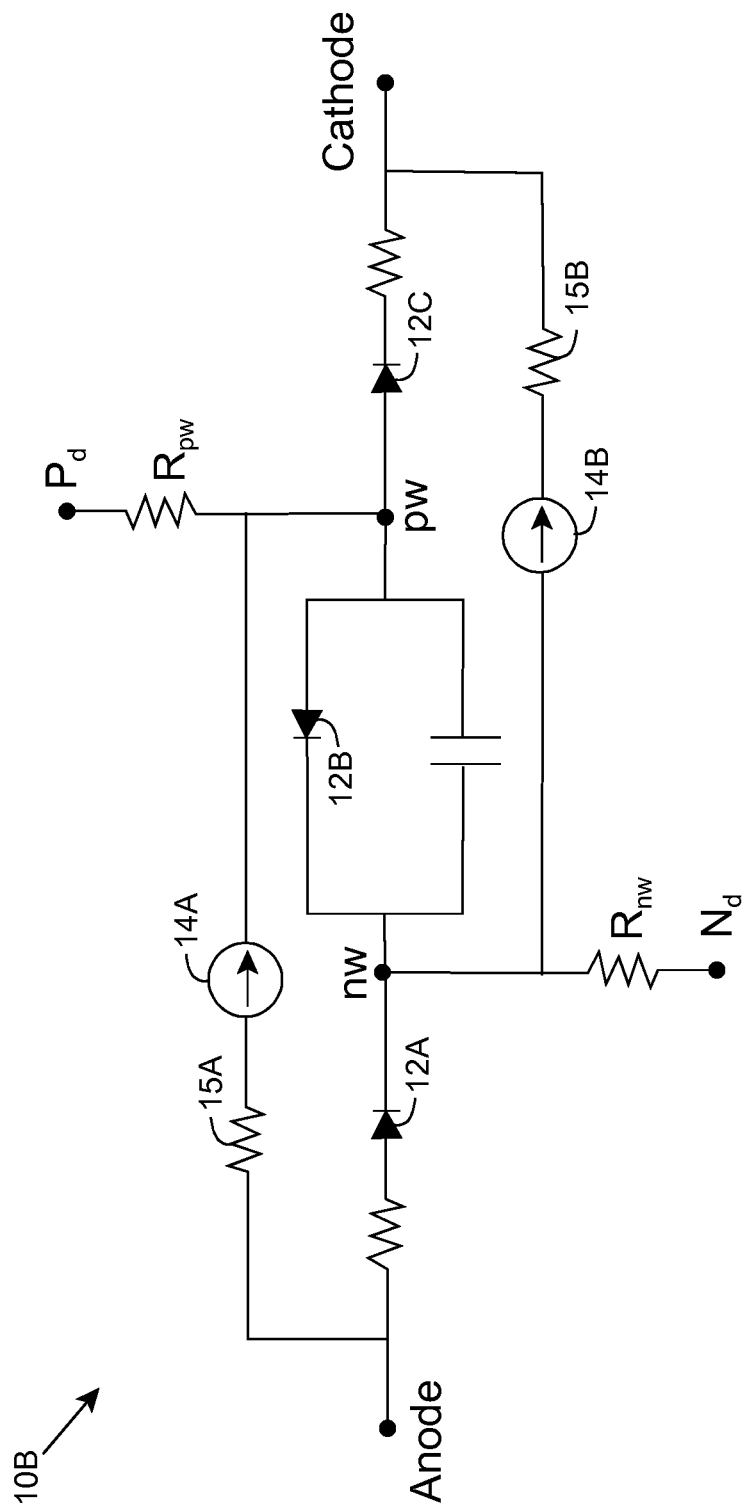
FIG. 4B shows an illustrative circuit diagram of a model of an SCR according to an alternative embodiment.

Alternatively, the SCR 2 can be electrically connected in a four terminal configuration, e.g., as part of a DTSCR, LVTSCR, and/or the like. To this extent, model 10A can be modified for configurations requiring a four terminal model. For example, FIG. 4B shows an illustrative circuit diagram of a model 10B of an SCR 2 (FIG. 1A) according to an alternative embodiment. Model 10B includes similar components as shown and described in conjunction with model 10A, but differs from model 10A in that $R_{nw}$ is connected between the n-well node and an external terminal, $N_d$ (e.g., n diffusion terminal), and $R_{pw}$ is connected between the p-well node and a second external terminal, $P_d$ (e.g., p diffusion terminal). As a result, model 10B has four terminals: the anode, cathode, $N_d$ and $P_d$. The parallel capacitor for diode 12B is the reverse bias capacitance of the diode 12B, and can be used to model the alternating current behavior of the SCR 2.

Figure 5:
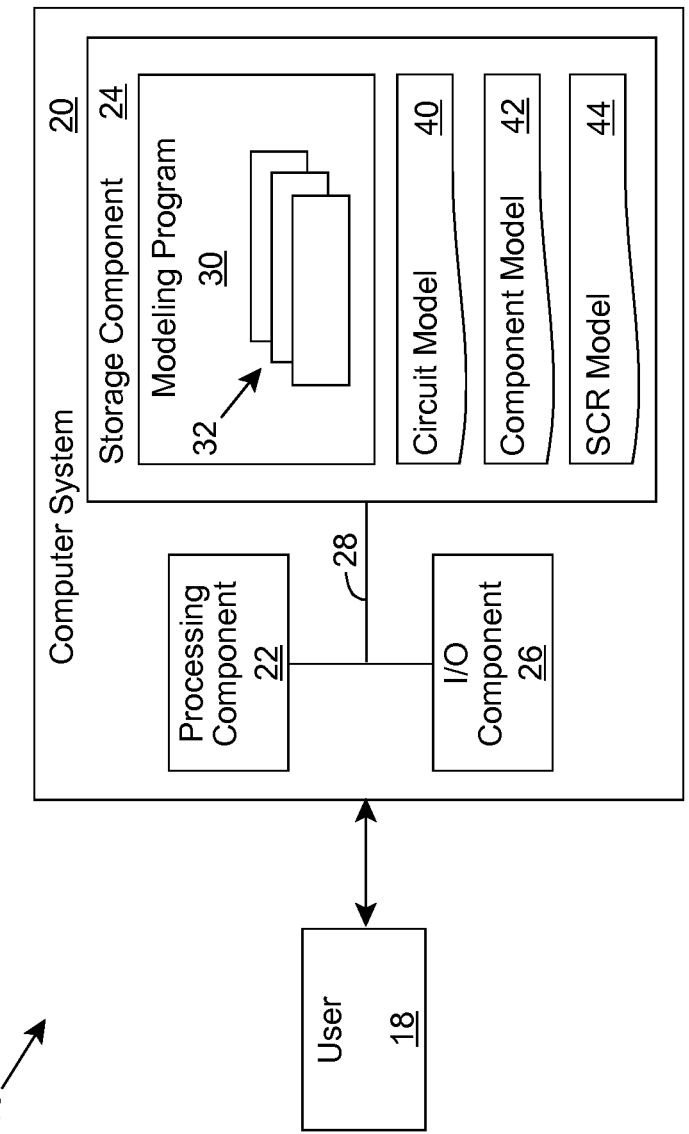
FIG. 5 shows an illustrative environment for modeling a circuit according to an embodiment.

Either circuit model 10A, 10B (collectively referred to as model 10) can be utilized to simulate the behavior of the circuit prior to manufacturing the circuit. To this extent, FIG. 5 shows an illustrative environment 16 for modeling a circuit according to an embodiment. Environment 16 includes a computer system 20 that can perform a process described herein in order to simulate the behavior of the circuit. In particular, computer system 20 is shown including a modeling program 30, which makes computer system 20 operable to simulate the behavior of the circuit by performing a process described herein.

Computer system 20 is shown including a processing component 22 (e.g., one or more processors), a storage component 24 (e.g., a storage hierarchy), an input/output (I/O) component 26 (e.g., one or more I/O interfaces and/or devices), and a communications pathway 28. In general, processing component 22 executes program code, such as modeling program 30, which is at least partially fixed in storage component 24. While executing program code, processing component 22 can process data, which can result in reading and/or writing transformed data from/to storage component 24 and/or I/O component 26 for further processing. Pathway 28 provides a communications link between each of the components in computer system 20. I/O component 26 can comprise one or more human I/O devices, which enable a human user 18 to interact with computer system 20 and/or one or more communications devices to enable a system user 18 to communicate with computer system 20 using any type of communications link. To this extent, modeling program 30 can manage a set of interfaces (e.g., graphical user interface(s), application program interface, and/or the like) that enable human and/or system users 18 to interact with modeling program 30. Further, modeling program 30 can manage (e.g., store, retrieve, create, manipulate, organize, present, etc.) the data, such as circuit model 40, using any solution.

In any event, computer system 20 can comprise one or more general purpose computing articles of manufacture (e.g., computing devices) capable of executing program code, such as modeling program 30, installed thereon. As used herein, it is understood that "program code" means any collection of instructions, in any language, code or notation, that cause a computing device having an information processing capability to perform a particular action either directly or after any combination of the following: (a) conversion to another language, code or notation; (b) reproduction in a different material form; and/or (c) decompression. To this extent, modeling program 30 can be embodied as any combination of system software and/or application software.

Further, modeling program 30 can be implemented using a set of modules 32. In this case, a module 32 can enable computer system 20 to perform a set of tasks used by modeling program 30, and can be separately developed and/or implemented apart from other portions of modeling program 30. As used herein, the term "component" means any configuration of hardware, with or without software, which implements the actions described in conjunction therewith using any solution, while the term "module" means program code that enables a computer system 20, such as a general purpose computing device, to implement the actions described in conjunction therewith using any solution. When fixed in a storage component 24 of a computer system 20 that includes a processing component 22, a module is a substantial portion of a component that implements the actions. Regardless, it is understood that two or more components, modules, and/or systems may share some/all of their respective hardware and/or software. Further, it is understood that some of the functionality discussed herein may not be implemented or additional functionality may be included as part of computer system 20.

When computer system 20 comprises multiple computing devices, each computing device can have only a portion of modeling program 30 fixed thereon (e.g., one or more modules 32). However, it is understood that computer system 20 and modeling program 30 are only representative of various possible equivalent computer systems that may perform a process described herein. To this extent, in other embodiments, the functionality provided by computer system 20 and modeling program 30 can be at least partially implemented by one or more computing devices that include any combination of general and/or specific purpose hardware with or without program code. In each embodiment, the hardware and program code, if included, can be created using standard engineering and programming techniques, respectively.

Regardless, when computer system 20 includes multiple computing devices, the computing devices can communicate over any type of communications link. Further, while performing a process described herein, computer system 20 can communicate with one or more other computer systems, such as a system user 18, using any type of communications link. In either case, the communications link can comprise any combination of various types of wired and/or wireless links; comprise any combination of one or more types of networks; and/or utilize any combination of various types of transmission techniques and protocols.

As discussed herein, modeling program 30 enables computer system 20 to simulate behavior of a circuit including at least one SCR 2. To this extent, modeling program 30 is configured to enable computer system 20 to manage circuit model 40, which computer system 20 can process to simulate the behavior of the circuit. In an embodiment, circuit model 40 comprises a set of models of components in a circuit and their interconnections. Each component of the circuit can comprise corresponding component model 42, which can be included within and/or referenced by circuit model 40. Each component model 42 can comprise a set of instructions that can be processed by computer system 20 to simulate one or more parameters of the operation of a corresponding physical embodiment of the component in a circuit. Similarly, circuit model 40 can include a set of instructions that can be processed by computer system 20 to simulate the interconnections of the components of a circuit, various inputs to the circuit, and resulting outputs of the circuit.

Figure 1B:
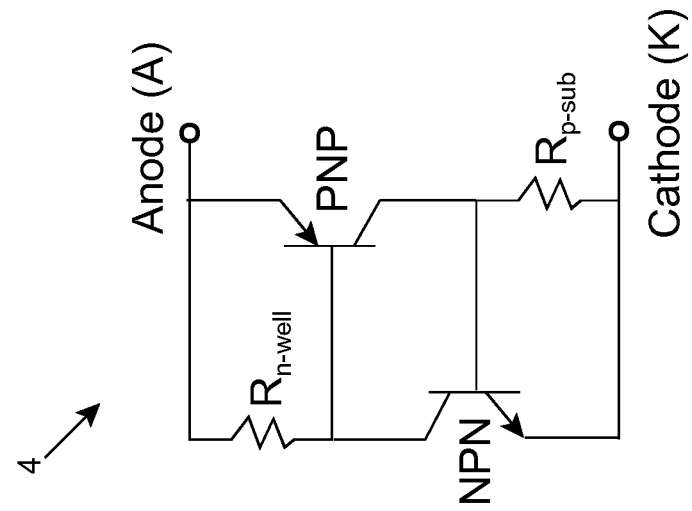
FIGS. 1A and 1B show an illustrative SCR and circuit diagram of the SCR, respectively, according to the prior art.
Figure 1A:
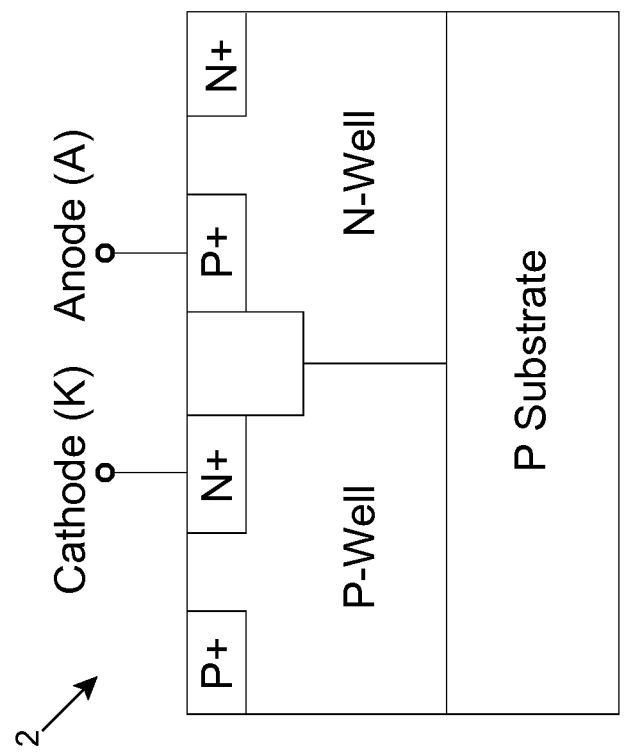
Figure 2:
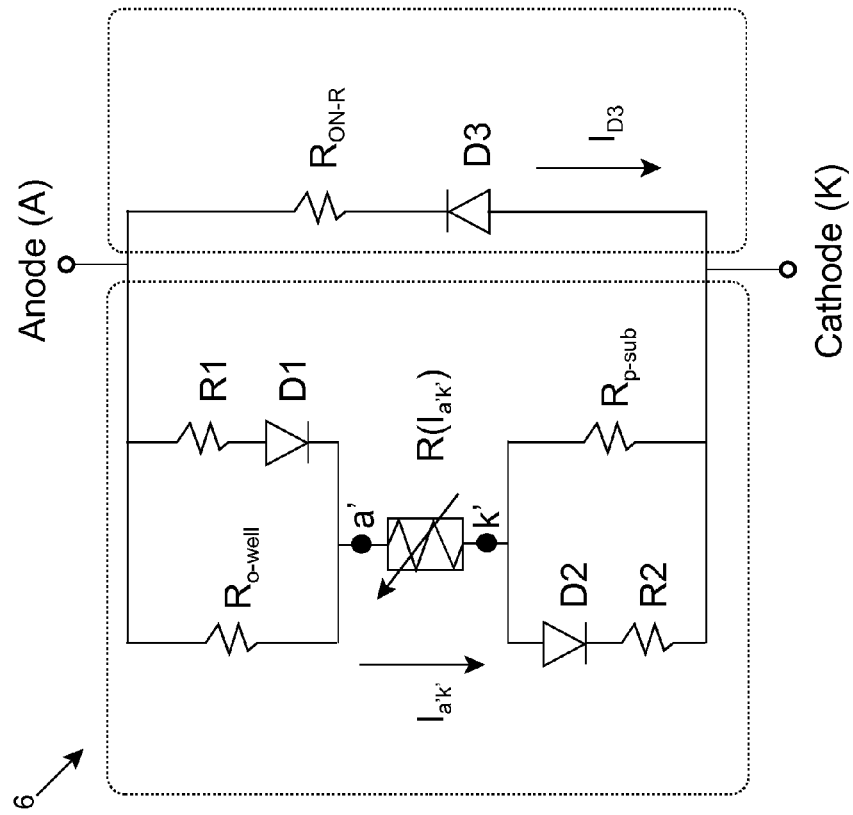
FIG. 2 shows an alternative circuit diagram of a model of an SCR according to the prior art.
Figure 3:
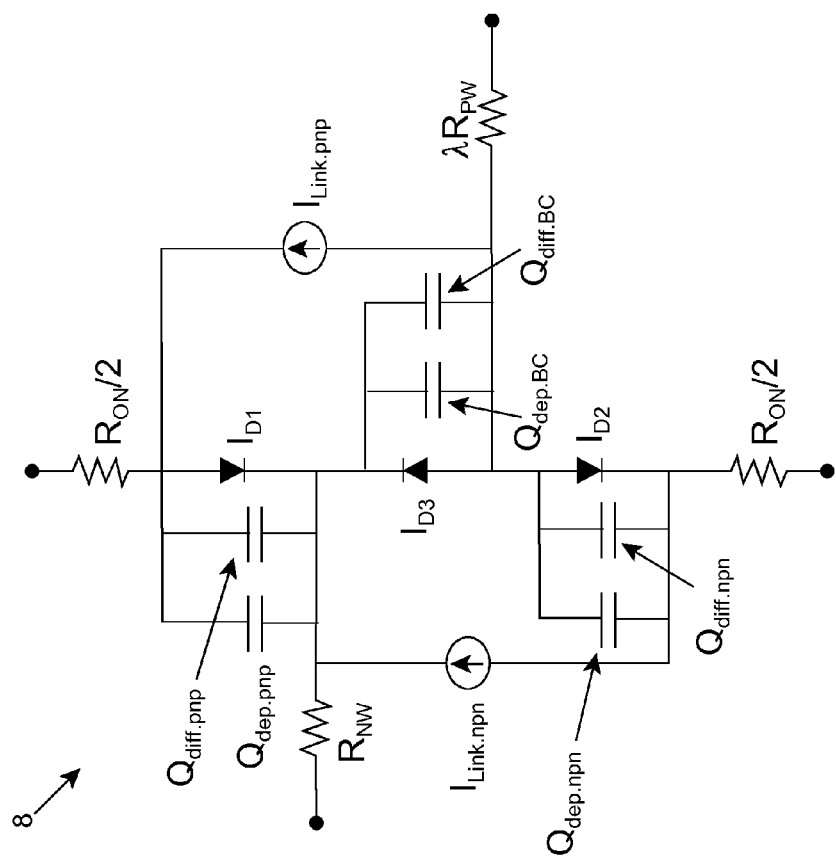
FIG. 3 shows another alternative circuit diagram of a model of an SCR according to the prior art.

SCR model 44 comprises a component model for SCR 2 (FIG. 1A). In an embodiment, SCR model 44 comprises a set of instructions that define model 10 (FIGS. 4A, 4B). To this extent, SCR model 44 can comprise a component model 42 for each diode 12A, 12B, 12C, a component model 42 for each voltage source 14A, 14B, as well as the interconnection data for model 10. In an embodiment, each diode 12A, 12B, 12C is modeled using a standard component model 42 for the corresponding type of diode 12A, 12B, 12C and technology (e.g., 90 nm complementary metal-oxide-semiconductor (CMOS) technology, 65 nm CMOS technology, and/or the like). In a more particular embodiment, diode 12A is modeled using a standard component model 42 for a p+nwell diode, diode 12C is modeled using a standard component model 42 for a n+pwell diode, and diode 12B is modeled using a standard component model 42 for a pwell-nwell diode.

Regardless, similar to circuit model 40, computer system 20 can process SCR model 44 to simulate operation of the various components of the SCR model 44, the interconnections of the components of the SCR model 44, various inputs to the SCR model 44, and resulting outputs of the SCR model 44. Computer system 20 can store the set of instructions for each circuit model 40, component model 42, and SCR model 44 as a file, a set of records in a database, or the like. In an embodiment, computer system 20 can manage a user interface that enables a user 18 to graphically define a circuit model 40 by selecting and connecting one or more component models 42.

Figure 6:
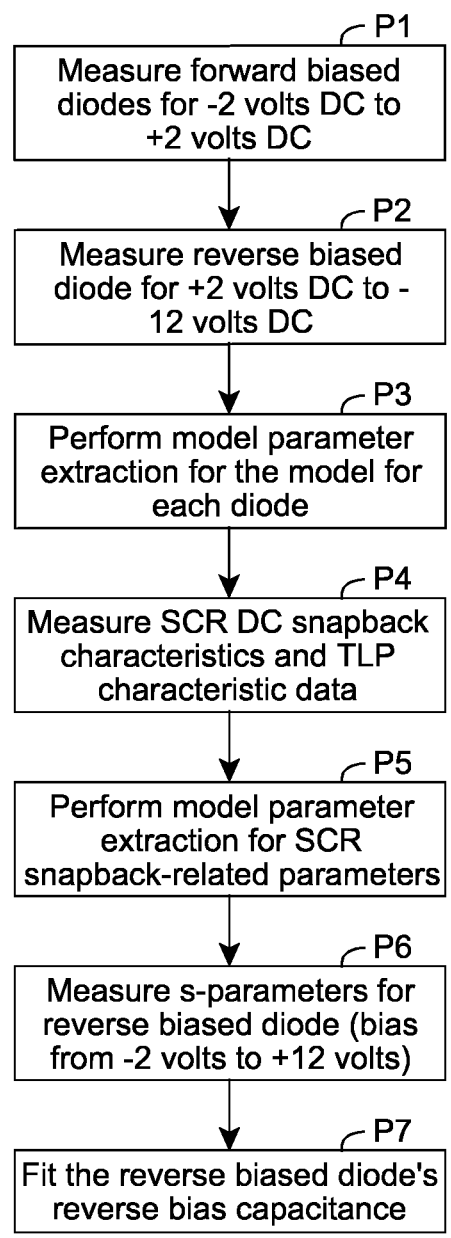
FIG. 6 shows an illustrative process for fitting the illustrative SCR model of FIG. 4 to the operation parameters for a corresponding SCR being simulated according to an embodiment.

FIG. 6 shows an illustrative process for fitting SCR model 10 (FIGS. 4A, 4B) parameters to the operation of a corresponding SCR 2 (FIG. 1A) being simulated, which can be implemented by environment 16 of FIG. 5, according to an embodiment. Referring to FIGS. 4A, 5, and 6, in process P1, computer system 20 can acquire DC measurement data for the DC operation of the forward biased diodes 12A, 12C of a physical SCR 2 for direct current (DC) voltages in the range of, for example, −2 to +2 volts DC. In process P2, computer system 20 can acquire DC measurement data for the DC operation of the reverse biased diode 12B of a physical SCR 2 for DC voltages in the range of, for example, +2 to −12 volts DC. For example, for each junction of the SCR 2, anode/n-well, n-well/p-well, and p-well/cathode, corresponding to a diode 12A, 12B, 12C of SCR model 10, respectively, a DC voltage difference can be applied across the junction and DC measurement data, such as the voltage and current across the junction of the SCR 2, can be measured as the DC voltage difference is adjusted within the range. It is understood that the voltage ranges are only illustrative, and that other voltage ranges can be utilized.

In process P3, computer system 20 can perform model parameter extraction for model 10 using the DC measurement data acquired in P1 and P2 to configure each diode 12A, 12B, 12C to accurately simulate DC operation of the corresponding junction of the SCR 2. For example, computer system 20 can adjust existing component models 42 for each diode 12A, 12B, 12C based on the DC measurement data for the corresponding junction of SCR 2. In this case, computer system 20 can modify a set of parameters for the component model 42 for one or more of the diodes 12A, 12B, 12C to fit the DC measurement data for the corresponding junction of the physical SCR 2 acquired in processes P1, P2. In an embodiment, computer system 20 can generate one or more plots indicating the simulated behavior of the component model 42 for the diode 12A, 12B, 12C and the corresponding DC measurement data for the junction. In this case, a user 18 can adjust the set of parameters for the component model 42 until the simulated behavior plot fits the DC measurement data with a desired level of accuracy. In particular, the reverse breakdown of the component model 42 for diode 12B should be accurate with respect to the n-well/p-well junction of the SCR 2 since the reverse breakdown is responsible for the modeled snapback of the SCR 2.

In process P4, computer system 20 can acquire DC snapback characteristic measurement data and transmission line pulse (TLP) characteristic data for the SCR 2 being modeled. In an embodiment, a physical SCR 2 is connected in the breakdown configuration, so that the anode terminal of the SCR 2 is electrically connected directly to the n-well contact (e.g., $N_d$), and the cathode terminal of the SCR 2 is electrically connected directly to the p-well contact (e.g., $P_d$). In this configuration, computer system 20 can perform a current force measurement of the SCR 2, in which the current at the anode terminal is ramped from, for example, 0 to 100 mA and computer system 20 acquires DC snapback characteristic data for the SCR 2, such as the voltage and current between the anode and cathode, while the current is being ramped up. Additionally, computer system 20 can perform a voltage force measurement, in which the voltage at the anode terminal is ramped from, for example, −2 to 12 volts DC and computer system 20 acquires DC snapback characteristic data for the SCR 2, such as the voltage and current between the anode and cathode, while the voltage is being ramped up. Furthermore, computer system 20 can perform a TLP test using varying pulses (e.g., 100 ns, 30 ns, 1 ns) on the physical SCR 2 to acquire TLP characteristic data for the physical SCR 2.

In process P5, computer system 20 can perform model parameter extraction for the DC snapback-related parameters of model 10 using the DC snapback characteristic measurement data and TLP characteristic data acquired in process P4. To this extent, computer system 20 can adjust the snapback parameters of model 10 to fit the DC snapback characteristic measurement data and TLP characteristic data for SCR 2. For example, computer system 20 can use the DC snapback characteristic measurement data acquired during the current force measurement to perform the snapback and post-snapback fitting of the diodes 12A, 12B, 12C of the model 10 using one or more plots of simulated behavior in conjunction with the DC snapback characteristic measurement data. Additionally, computer system 20 can use the DC snapback characteristic measurement data acquired during the voltage force measurement for on state (post snapback) fitting of the diodes 12A, 12B, 12C of the model 10 using one or more plots of simulated behavior in conjunction with the DC snapback characteristic measurement data. Still further, computer system 20 can use the TLP characteristic data for the physical SCR 2 to further fit the model 10, e.g., the parameters of the mathematical formula for each current controlled voltage source 14A, 14B, to the behavior of the SCR 2 using one or more plots of simulated behavior in conjunction with the TLP characteristic data. In an embodiment, model 10 includes multiple sets of parameters for the mathematical formula, each of which fits the behavior of SCR 2 for a unique type of electrostatic discharge event. For example, a first set of parameters can be selected to simulate a human body model (HBM) electrostatic discharge event (e.g., 100 ns TLP), another set of parameters can be selected to simulate a machine model electrostatic discharge event (e.g., 30 ns TLP), etc. In this case, when a particular type of electrostatic discharge event is to be simulated using model 10, the corresponding set of parameters for the current controlled voltage sources 14A, 14B can be selected and utilized.

In process P6, computer system 20 can acquire s-parameters measurement data for the junction between the n-well and p-well of the SCR 2. In an embodiment, computer system 20 can acquire the s-parameters measurement data for the SCR 2 while a test frequency in the range of approximately 100 megahertz to 50 gigahertz is applied to the n-well and the voltage bias between the n-well and p-well of the SCR 2 is varied between −2 to +12 volts DC. However, it is understood that the voltage range and frequency are only illustrative, and another voltage range and/or frequency can be used.

In process P7, computer system 20 can fit the reverse bias capacitance for the reverse biased diode 12B based on the s-parameters measurement data for the n-well/p-well junction of SCR 2. For example, the reverse bias capacitance for diode 12B can be adjusted until a simulated CV curve for diode 12B is sufficiently close to a measured CV curve for the n-well/p-well junction of SCR 2.

While an illustrative model 10 for a BDSCR has been shown and described, it is understood that the model 10 and parameter extractions shown and described herein can be modified to any SCR design, such as LVTSCR, DTSCR, and/or the like. For example, model 10 can be extended to a four terminal model, and the various components utilized to configure the breakdown voltage can be added to the model.

Although the generation of model 10 described herein as been shown and described with reference to a single SCR 2, it is understood that model 10 can be generated based on measurement data acquired for multiple SCRs. For example, measurement data for a statistically significant sample size of SCRs of a particular technology can be combined (e.g., averaged) to provide a set of typical performance attributes for an SCR. Similarly, multiple models 10 can be generated for SCRs manufactured using different technologies, different geometries, and/or the like, and models 10 can be used to compare the behavior of the different SCRs when implemented in different circuits.

While shown and described herein as a model 10 and method and system for generating the model 10, it is understood that aspects of the invention further provide various alternative embodiments. For example, in one embodiment, the invention provides a computer program fixed in at least one computer-readable medium, which when executed, enables a computer system to simulate a circuit including an SCR using the model 10. To this extent, the computer-readable medium includes program code, such as modeling program 30 and SCR model 44, which implements some or all of a process described herein. It is understood that the term "computer-readable medium" comprises one or more of any type of tangible medium of expression, now known or later developed, from which a copy of the program code can be perceived, reproduced, or otherwise communicated by a computing device. For example, the computer-readable medium can comprise: one or more portable storage articles of manufacture; one or more memory/storage components of a computing device; paper; and/or the like.

Figure 7:
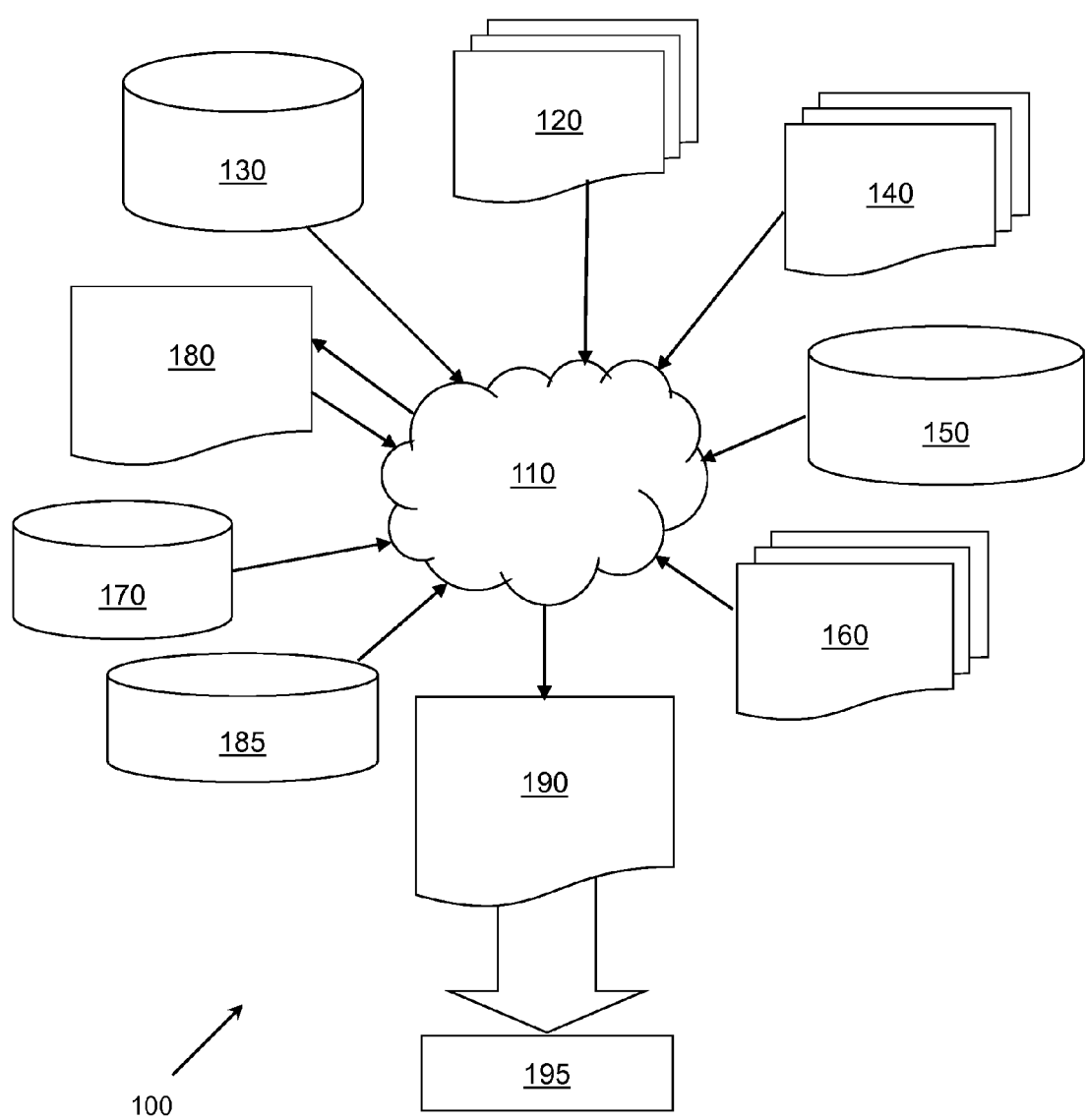
FIG. 7 shows a flow diagram of an illustrative design process used in semiconductor design, manufacturing, and/or test according to an embodiment.

In another embodiment, model 10 is utilized to evaluate a circuit, e.g., as part of a computerized process for designing, manufacturing and/or testing the circuit. To this extent, FIG. 7 shows a flow diagram of an illustrative design process, which can be implemented by computer system 20 (FIG. 5), and used in semiconductor design, manufacturing, and/or test according to an embodiment.

Design flow 100 may vary depending on a type of integrated circuit (IC) being designed. For example, a design flow 100 for building an application specific IC (ASIC) may differ from a design flow 100 for designing a standard component. Design structure 120 is preferably an input to a design process 110 and may come from an intellectual property (IP) provider, a core developer, or other design company or may be generated by the operator of the design flow, or from other sources. Design structure 120 comprises a set of instructions defining a circuit, such as circuit model 40, component model 42, and/or SCR model 44 of FIG. 5, in the form of schematics, a hardware-description language (HDL, such as Verilog, VHDL, C, etc.), and/or the like. Design structure 120 can be embodied on one or more computer-readable media. For example, design structure 120 can be embodied as a text file, a graphical representation of a circuit, and/or the like, which is stored on a computer-readable storage medium. Design process 110 can synthesize (or translate) design structure 120 into a netlist 180, where netlist 180 is, for example, a list of wires, transistors, logic gates, control circuits, I/O, models, etc., which describes the connections to other elements and circuits in an integrated circuit design. Netlist 180 can be embodied on at least one computer-readable medium. Generation of netlist 180 can be an iterative process in which netlist 180 is re-synthesized one or more times depending on design specifications and/or parameters for the circuit.

Design process 110 can use a variety of inputs. For example, design process 110 can use inputs from library elements 130, which can comprise a set of commonly used elements, circuits, and devices, including models (e.g., component model(s) 42 and/or SCR model 44), layouts, and symbolic representations, for a given manufacturing technology (e.g., different technology nodes, 32 nm, 45 nm, 90 nm, etc.), design specifications 140, characterization data 150, verification data 160, design rules 170, and test data files 185 (which can include test patterns and other testing information). Design process 110 can further include, for example, standard circuit design processes such as timing analysis, verification, design rule checking, place and route operations, etc. One of ordinary skill in the art of integrated circuit design can appreciate the extent of possible electronic design automation tools and applications used in design process 110 without deviating from the scope and spirit of the invention. The design structure of the invention is not limited to any specific design flow.

In an embodiment, design process 110 can translate design structure 120, along with the remainder of the integrated circuit design (if applicable), into a final design structure 190 (e.g., information embodied on a GDS storage medium). Final design structure 190 can comprise information such as, for example, test data files, design content files, manufacturing data, layout parameters, wires, levels of metal, vias, shapes, test data, data for routing through the manufacturing line, and any other data required by a semiconductor manufacturer to produce a physical embodiment of the corresponding circuit. Final design structure 190 can be utilized in a stage 195, in which, for example, final design structure 190: is provided for tape-out, is released to manufacturing, is sent to another design house, is sent back to a customer, and/or the like.

In another embodiment, the invention provides a method of providing a copy of program code, such as modeling program 30, circuit model 40, SCR model 44, and/or the like, which implements some or all of a process described herein. In this case, a computer system can process a copy of program code that implements some or all of a process described herein to generate and transmit, for reception at a second, distinct location, a set of data signals that has one or more of its characteristics set and/or changed in such a manner as to encode a copy of the program code in the set of data signals. Similarly, an embodiment of the invention provides a method of acquiring a copy of program code that implements some or all of a process described herein, which includes a computer system receiving the set of data signals described herein, and translating the set of data signals into a copy of the computer program fixed in at least one computer-readable medium. In either case, the set of data signals can be transmitted/received using any type of communications link.

In still another embodiment, the invention provides a method of generating a system for developing the model 10. In this case, a computer system, such as computer system 20 (FIG. 5), can be obtained (e.g., created, maintained, made available, etc.) and one or more components for performing a process described herein can be obtained (e.g., created, purchased, used, modified, etc.) and deployed to the computer system. To this extent, the deployment can comprise one or more of: (1) installing program code on a computing device; (2) adding one or more computing and/or I/O devices to the computer system; (3) incorporating and/or modifying the computer system to enable it to perform a process described herein; and/or the like.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

What is claimed is:

1. A computer-implemented method of generating an SCR model for at least one silicon controlled rectifier (SCR), the method comprising:

including a unique diode model for each of a plurality of diodes electrically connected in series in the SCR model, the plurality of diode models including:
a first forward biased diode model electrically connected between an anode terminal and a n-well node of the SCR model and corresponding to a first junction between an anode and a n-well of the at least one SCR;
a second forward biased diode model electrically connected between a p-well node and a cathode terminal of the SCR model and corresponding to a second junction between a p-well and a cathode of the at least one SCR; and
a reverse biased diode model electrically connected between the n-well node and the p-well node of the SCR model and corresponding to a third junction between the n-well and the p-well of the at least one SCR; and
adjusting, using a computer, a set of parameters for each unique diode model using DC measurement data for the corresponding junction of the at least one SCR.

2. The method of claim 1, further comprising acquiring the DC measurement data for each of the corresponding junctions of the at least one SCR, wherein the acquiring includes:
acquiring DC measurement data for the first and second junctions for a DC voltage range of approximately −2 to approximately +2 volts DC; and
acquiring DC measurement data for the third junction for a DC voltage range of approximately +2 to approximately −12 volts DC.

3. The method of claim 1, further comprising adjusting the set of parameters for each unique diode model using DC snapback characteristic data for the at least one SCR.

4. The method of claim 1, further comprising:
including at least one current controlled voltage source in the SCR model, wherein the at least one current controlled voltage source is electrically connected in parallel with two of the plurality of diode models between at least one of: the anode terminal and the p-well node of the SCR model or the n-well node and the cathode terminal of the SCR model, and wherein the at least one current controlled voltage source comprises a high resistance compared to a corresponding parallel path of diode models in the SCR model for operation of the SCR model before snapback and a low resistance compared to the corresponding parallel path of diode models in the SCR model for operation of the SCR model after snapback; and
adjusting a set of parameters for the at least one current controlled voltage source using transmission line pulse (TLP) characteristic data for the at least one SCR.

5. The method of claim 4, wherein the SCR model further includes at least one resistance electrically connected in series with the at least one current controlled voltage source.

6. The method of claim 1, further comprising adjusting the set of parameters for the reverse biased diode model using s-parameters measurement data for the third junction of the at least one SCR.

7. The method of claim 1, wherein the SCR model is configured to simulate the at least one SCR in breakdown configuration, the method further comprising:
including a first resistance electrically connected between the anode terminal and the n-well node of the SCR model in parallel with the first forward biased diode model; and
including a second resistance electrically connected between the p-well node and the cathode terminal of the SCR model in parallel with the second forward biased diode model.

8. A computer-implemented method of evaluating a circuit, the method comprising:
obtaining a circuit model for the circuit, the circuit model including an SCR model for a silicon controlled rectifier (SCR) including a plurality of diodes electrically connected in series to the circuit model, wherein the SCR model includes:
a first forward biased diode model electrically connected between an anode terminal and a n-well node of the SCR model, wherein the first forward biased diode model is configured to simulate DC operation of a first junction between an anode and a n-well of the SCR;
a second forward biased diode model electrically connected between a p-well node and a cathode terminal of the SCR model, wherein the second forward biased diode model is configured to simulate DC operation of a second junction between a p-well and a cathode of the SCR; and
a reverse biased diode model electrically connected between the n-well node and the p-well node of the SCR model, wherein the reverse biased diode model is configured to simulate DC operation of a third junction between the n-well and the p-well of the SCR; and
simulating behavior of the circuit using the circuit model.

9. The method of claim 8, wherein the SCR model further includes at least one current controlled voltage source, wherein the at least one current controlled voltage source is electrically connected in parallel with two of the plurality of diode models between at least one of: the anode terminal and the p-well node of the SCR model or the n-well node and the cathode terminal of the SCR model, and wherein the at least one current controlled voltage source comprises a high resistance compared to a corresponding parallel path of diode models in the SCR model for operation of the SCR model before snapback and a low resistance compared to the corresponding parallel path of diode models in the SCR model for operation of the SCR model after snapback.

10. The method of claim 9, wherein the SCR model further includes at least one resistance electrically connected in series with the at least one current controlled voltage source.

11. The method of claim 8, wherein the obtaining includes generating the SCR model, the generating including adjusting a set of parameters for each unique diode model using DC measurement data for the corresponding junction of the SCR.

12. The method of claim 11, wherein the generating further includes adjusting the set of parameters for each unique diode model using DC snapback characteristic data for the SCR.

13. The method of claim 11, wherein the SCR model further includes at least one current controlled voltage source, wherein the at least one current controlled voltage source is electrically connected in parallel with two of the plurality of diode models between at least one of: the anode terminal and the p-well node of the SCR model or the n-well node and the cathode terminal of the SCR model, the generating further including adjusting a set of parameters for the at least one current controlled voltage source using transmission line pulse (TLP) characteristic data for the SCR.

14. The method of claim 11, wherein the generating further includes adjusting the set of parameters for the reverse biased diode model using s-parameters measurement data for the third junction of the at least one SCR.

15. The method of claim 8, wherein the circuit model includes an electrostatic discharge (ESD) protection circuit including the SCR model.

16. A computer system comprising:
a set of computing devices configured to generate an SCR model for at least one silicon controlled rectifier (SCR) by performing actions comprising:
including a unique diode model for each of a plurality of diodes electrically connected in series in the SCR model, the plurality of diode models including:
a first forward biased diode model electrically connected between an anode terminal and a n-well node of the SCR model and corresponding to a first junction between an anode and a n-well of the at least one SCR;
a second forward biased diode model electrically connected between a p-well node and a cathode terminal of the SCR model and corresponding to a second junction between a p-well and a cathode of the at least one SCR; and
a reverse biased diode model electrically connected between the n-well node and the p-well node of the SCR model and corresponding to a third junction between the n-well and the p-well of the at least one SCR; and
adjusting a set of parameters for each unique diode model using DC measurement data for the corresponding junction of the at least one SCR.

17. The computer system of claim 16, wherein the actions further comprise adjusting the set of parameters for each unique diode model using DC snapback characteristic data for the at least one SCR.

18. The computer system of claim 16, wherein the actions further comprise:
including at least one current controlled voltage source in the SCR model, wherein the at least one current controlled voltage source is electrically connected in parallel with two of the plurality of diode models between at least one of: the anode terminal and the p-well node of the SCR model or the n-well node and the cathode terminal of the SCR model, and wherein the at least one current controlled voltage source comprises a high resistance compared to a corresponding parallel path of diode models in the SCR model for operation of the SCR model before snapback and a low resistance compared to the corresponding parallel path of diode models in the SCR model for operation of the SCR model after snapback; and
adjusting a set of parameters for the at least one current controlled voltage source using transmission line pulse (TLP) characteristic data for the at least one SCR.

19. The computer system of claim 16, wherein the actions further comprise adjusting the set of parameters for the reverse biased diode model using s-parameters measurement data for the third junction of the at least one SCR.

20. A computer system comprising:
a set of computing devices configured to evaluate a circuit by performing actions comprising:
obtaining a circuit model for the circuit, the circuit model including an SCR model for a silicon controlled rectifier (SCR) including a plurality of diodes electrically connected in series to the circuit model, wherein the SCR model includes:
a first forward biased diode model electrically connected between an anode terminal and a n-well node of the SCR model, wherein the first forward biased diode model is configured to simulate DC operation of a first junction between an anode and a n-well of the SCR;
a second forward biased diode model electrically connected between a p-well node and a cathode terminal of the SCR model, wherein the second forward biased diode model is configured to simulate DC operation of a second junction between a p-well and a cathode of the SCR; and
a reverse biased diode model electrically connected between the n-well node and the p-well node of the SCR model, wherein the reverse biased diode model is configured to simulate DC operation of a third junction between the n-well and the p-well of the SCR; and
simulating behavior of the circuit using the circuit model.

21. The computer system of claim 20, wherein the obtaining includes generating the SCR model, the generating including adjusting a set of parameters for each unique diode model using DC measurement data for the corresponding junction of the SCR.

22. The computer system of claim 21, the generating further including adjusting the set of parameters for each unique diode model using DC snapback characteristic data for the SCR.

23. The computer system of claim 21, wherein the SCR model further includes at least one current controlled voltage source, wherein the at least one current controlled voltage source is electrically connected in parallel with two of the plurality of diode models between at least one of: the anode terminal and the p-well node of the SCR model or the n-well node and the cathode terminal of the SCR model, the generating further including adjusting a set of parameters for the at least one current controlled voltage source using transmission line pulse (TLP) characteristic data for the SCR.

24. The computer system of claim 21, the generating further including adjusting the set of parameters for the reverse biased diode model using s-parameters measurement data for the third junction of the at least one SCR.

25. A computer program comprising program code embodied in at least one computer-readable storage medium, which when executed, enables a computer system to implement a method of generating an SCR model for at least one silicon controlled rectifier (SCR), the method comprising:
including a unique diode model for each of a plurality of diodes electrically connected in series in the SCR model, the plurality of diode models including:
a first forward biased diode model electrically connected between an anode terminal and a n-well node of the SCR model and corresponding to a first junction between an anode and a n-well of the at least one SCR;
a second forward biased diode model electrically connected between a p-well node and a cathode terminal of the SCR model and corresponding to a second junction between a p-well and a cathode of the at least one SCR; and
a reverse biased diode model electrically connected between the n-well node and the p-well node of the SCR model and corresponding to a third junction between the n-well and the p-well of the at least one SCR; and
adjusting a set of parameters for each unique diode model using DC measurement data for the corresponding junction of the at least one SCR.

* * * * *